United States Patent [19]
Miyashita et al.

[11] Patent Number: 5,652,545
[45] Date of Patent: Jul. 29, 1997

[54] WIDE-BAND AMPLIFIER

[75] Inventors: Miyo Miyashita; Masaaki Shimada; Kazuya Yamamoto, all of Hyogo, Japan

[73] Assignee: Mitsubishi Denki Kabushiki Kaisha, Tokyo, Japan

[21] Appl. No.: 609,788

[22] Filed: Mar. 1, 1996

[30] Foreign Application Priority Data

Jun. 22, 1995 [JP] Japan .................... 7-155951

[51] Int. Cl.$^6$ .................................. H03F 3/26
[52] U.S. Cl. .................. 330/269; 330/253; 330/255; 330/306
[58] Field of Search .................. 330/119, 193, 330/194, 253, 255, 269, 264, 271, 302, 306

[56] References Cited

U.S. PATENT DOCUMENTS 4,963,835 10/1990 Saitoh ..................... 330/253

FOREIGN PATENT DOCUMENTS 567933 3/1993 Japan .
6334448 12/1994 Japan .

OTHER PUBLICATIONS

Kai-Yap Toh; "A 23-ps/2.1-mW ECL Gate with an AC-Coupled Active Pull-Down Emitter-Follower Stage"; IEEE Journal of Solid-State Circuits, vol. 24, No. 5, Oct. 1989.

Toshiki Seshita et al.; "20GHz 8b Multilexer Implemented with 0.5μm WNx/W-Gate GaAs MESFETs"; IEEE ISSCC Digest of Technical Papers; pp. 172-173, Feb. 1994.

Primary Examiner—James B. Mullins
Attorney, Agent, or Firm—Leydig, Voit & Mayer

[57] ABSTRACT

A differential amplifier is connected to a push-pull-type source follower circuit that receives biphase signals. The source follower circuit has a first set of FETs including a first source follower FET and a first current source FET and a second set of FETs including a second source follower FET and a second current source FET. A first coupling capacitance element connects the first current source FET and the second source follower FET, and a second coupling capacitance element connects the second current source FET and the first source follower FET. A diode or a resistor connects the source terminals of the first and second current source FETs to a voltage source.

18 Claims, 10 Drawing Sheets

WIDE-BAND AMPLIFIER

BACKGROUND OF THE INVENTION

1. Field of the Invention

The present invention relates to a wide-band amplifier that assures satisfactory output characteristics over a wide operation frequency range of DC to several tens of gigahertz.

2. Description of the Related Art

FIG. 12 is a circuit diagram showing a conventional wide-band amplifier capable of receiving biphase signals. In FIG. 12, reference numeral 1 denotes a differential amplifier. A level-shift first source follower circuit 2 shifts an output voltage of the differential amplifier 1 to a predetermined level. An impedance conversion second source follower circuit 3 is connected to the first source follower circuit 2. Further, symbol $V_{SS}$ is a voltage source; IN1, an input terminal; IN2, an inverted input terminal; OUT1, an output terminal; and OUT2, an inverted output terminal.

In the differential amplifier 1, Tr1, Tr2 and Tr3 are field-effect transistors (hereinafter abbreviated as FETs), R1 and R2 are load resistors, and D1 is a level-shift diode. In the first source follower circuit 2, Tr4 and Tr5 are source follower FETs, Tr6 and Tr7 are current source FETs, and D2 and D3 are level-shift diodes. The stage of the source follower FET Tr5 processes a signal that is inverted from a signal that is processed by the stage of the source follower FET Tr4. In the second source follower circuit 3, D4 and D5 are level-shift diodes, Tr8 and Tr9 are source follower FETs, and Tr10 and Tr11 are current source FETs. The stage of the source follower FET Tr9 processes a signal that is inverted from a signal that is processed by the stage of the source follower FET Tr8.

The operation of the wide-band amplifier having the above configuration will be described below with assumptions that a current flowing through the FET Tr3 is denoted by $I_C$ and the resistors R1 and R2 have a resistance $R_L$. When high-level and low-level signals are respectively applied to the input terminal IN1 and the inverted input terminal IN2, the FET Tr1 is switched on and the FET Tr2 is switched off, so that the current $I_C$ flows through the FET Tr1. On the other hand, when low-level and high-level signals are respectively applied to the input terminal IN1 and the inverted input terminal IN2, the FET Tr1 is switched off and the FET Tr2 is switched on, so that the current $I_C$ flows through the FET Tr2. A signal that is output from the drain terminal of the FET Tr1 or TR2 and supplied to the first source follower circuit 2 has an amplitude $\Delta V = R_L \times I_C$.

The source follower circuit 2, actually the level-shift diodes D2 and D3, performs DC level shift on a signal that has been level-shifted by the differential amplifier 1, to obtain an output level that is required for the wide-band amplifier.

FIG. 13A shows the first source follower circuit 2 being in a state that a gate voltage of the source follower FET Tr4 has just become a high level. At an instant that a high-level output signal is supplied from the differential amplifier 1 to the source follower FET Tr4, a gate-source voltage of the source follower FET Tr4 increases (by $\Delta V_H$) and a drain current increases (by $\Delta I_{D1}$). If the internal resistance (source-drain resistance $R_{DS}$) of the current source FET Tr6 is sufficiently large, the drain current $\Delta I_{D1}$ flows into the gate terminal of the source follower FET Tr8 of the second source follower circuit 3, to charge up an input capacitance $C_t$ (gate-source capacitance $C_{GS}$ plus gate-drain capacitance $C_{GD}$) of the source follower FET Tr8. In general, a voltage V across a capacitance C is a time-integration of a current flowing therethrough, i.e., changes according to $V = (1/C) \int i \, dt$. Therefore, a gate voltage of the source follower FET Tr8, i.e., a source voltage of the source follower FET Tr4 increases by $\Delta V_H$ as time elapses, so that the gate-source voltage of the source follower FET Tr4 decreases by $\Delta V_H$. Thus, the injection current $I_{D1}$ decreases to zero.

In this case, to quickly switch the gate voltage of the source follower FET Tr8 from a low level to a high level (i.e., to reduce a rise time tr), the current $\Delta I_{D1}$ that is drawn from the source follower FET Tr4 needs to be increased. This can be attained by increasing the size of the FET Tr4. However, if the FET Tr4 were made too large, the load (i.e., input capacitance $C_t$ of the source follower FET Tr4) with respect to an output of the prior-stage differential amplifier 1 would become unduly large, deteriorating the switching operation of the differential amplifier 1. In the wide-band amplifier of FIG. 12, the load with respect to an output of the differential amplifier 1 is reduced by using the two-stage source follower circuits 2 and 3 in which the size of the source follower FETs of the second source follower circuit 3 is larger than that of the first source follower circuit 2. Source follower circuits of more than two stages may be employed to implement a very-high-speed amplifier.

FIG. 13B shows the first source follower circuit 2 being in a state that the gate voltage of the source follower FET Tr4 has just become a low level. At an instant that a low-level output signal is supplied from the differential amplifier 1 to the source follower FET Tr4, the gate-source voltage of the source follower FET Tr4 decreases (by $\Delta V_L$), so that the drain current decreases (by $\Delta I_{D2}$) and the internal resistance increases. Since a constant current is flowing through the current source FET Tr6, to cause the source voltage of the source follower FET Tr4 by $\Delta V_L$, the charge that has been stored in the input capacitance $C_t$ of the source follower FET Tr8 is released and a discharge current flows through the current source FET Tr6 as its drain current. To quickly switch the gate voltage of the source follower FET Tr8 from a high level to a low level (i.e., to reduce a fall time tf), the drain current of the current source FET Tr6 needs to be increased, resulting in increased power consumption of the entire circuit.

The principle of operation of the second source follower circuit 3 is similar to that of the first source follower circuit 2.

In the wide-band amplifier having the source follower circuits as described above, the increase of the number of stages of source follower circuits improves the high-speed switching characteristic, but deteriorates the bandwidth characteristic.

To solve this problem, an amplifier has been proposed which employs a push-pull-type source follower circuit. FIG. 14 is a circuit diagram showing a conventional amplifier of such type as disclosed in Toshiki Seshita et al.: "20 GHz 8b Multiplexer Implemented with 0.5 μm WN$_x$/W-Gate GaAs MESFETs," IEEE ISSCC Digest of Technical Papers, pp. 172–173, February 1994.

The components given the same reference symbols in FIGS. 12 and 14 are the same or corresponding ones. In FIG. 14, a differential amplifier 1 employs a level-shift resistor R4 in place of the level-shift diode D1 of FIG. 12. In a source follower circuit 4, current source FETs Tr6 and Tr7, source follower FETs Tr4 and Tr5, and diodes D2 and D3 are the same as those in the first source follower circuit 2 of FIG. 12. Gate voltages of the current source FETs Tr6 and Tr7 are given by a bias circuit including series resistors R5 and R6 and series resistors R7 and R8 that are provided between the ground and a voltage source $V_{SS}$. Source voltages of the current source FETs Tr6 and Tr7 are given via diodes D4 and D5, respectively. A node ND1 at the source terminal of the source follower FET Tr4 is connected, via a capacitor C2, to a node ND4 at the gate terminal of the current source FET Tr7 of an inverted signal processing stage. A node ND2 at the source terminal of the source follower FET Tr5 of the inverted signal processing stage is connected, via a capacitor C1, to a node ND3 at the gate terminal of the current source FET Tr6.

With the above push-pull-type configuration, when a low-level signal is applied to the source follower circuit 4, the current source FET Tr6 receives an inverted signal and therefore turns on, to increase a current flowing therethrough. Thus, the current source FET Tr6 more easily draws charge stored in an input capacitance of a next-stage circuit, resulting in a shorter signal fall time tf. Conversely, when a high-level signal is applied to the source follower circuit 4, the current flowing into the current source FET Tr6 is reduced. Since the current that is allowed to flow into the next-stage input capacitance is increased as much, a signal rise time tr can be shortened. Further, since the drive currents can be controlled by switching of the current source FETs Tr6 and Tr7, the high-speed switching characteristic can be improved with almost no increase of the power consumption of the bias circuit. Still further, because the bandwidth of the source follower circuit 4 is increased by virtue of the frequency characteristics of the coupling capacitors C1 and C2, the bandwidth of the entire wide-band amplifier can be increased.

However, in the conventional wide-band amplifier using the push-pull-type source follower circuit 4, to make the gate voltages of the current source FETs Tr6 and Tr7 lower than their source voltages when they are turned off, the diodes D4 and D5 are connected to the source terminals of the respective FETs, negative feedback is effected by the internal resistances of the diodes D4 and D5. As a result, the switching characteristics of the current source FETs Tr6 and Tr7 are deteriorated, which in turn deteriorates the high-speed switching characteristic of the source follower circuit 4.

SUMMARY OF THE INVENTION

An object of the present invention is to improve high-speed switching characteristic of a wide-band amplifier having a push-pull-type source follower circuit which amplifier has a sufficiently wide bandwidth and low power consumption. Another object of the invention is to provide a wide-band amplifier having a sufficiently wide bandwidth and sufficiently high switching speed as well as low power consumption which amplifier does not have the above push-pull-type source follower circuit.

According to a first aspect of the invention, there is provided a wide-band amplifier comprising:

a push-pull-type source follower circuit receiving biphase signals, comprising:
a first set of FETs including a first source follower FET and a first current source FET and a second set of FETs including a second source follower FET and a second current source FET, source terminals of the first and second current FETs being connected to each other;
a first coupling capacitance element connecting the first current source FET and the second source follower FET;
a second coupling capacitance element connecting the second current source FET and the first source follower FET; and
an element having a resistance component and connecting a connecting point of the source terminals of the first and second current source FETs to a voltage source.

According to a second aspect of the invention, in the wide-band amplifier of the first aspect, the element is a diode.

According to a third aspect of the invention, in the wide-band amplifier of the first aspect, the element is a resistor.

According to a fourth aspect of the invention, there is provided a wide-band amplifier comprising:

a push-pull-type source follower circuit receiving biphase signals, comprising:
a first set of FETs including a first source follower FET and a first current source FET and a second set of FETs including a second source follower FET and a second current source FET;
a first coupling capacitance element connecting the first current source FET and the second source follower FET;
a second coupling capacitance element connecting the second current source FET and the first source follower FET;
resistors connecting respective source terminals of the first and second current source FETs to a voltage source; and
bypass capacitance elements connected in parallel to the respective resistors.

According to a fifth aspect of the invention, in the wide-band amplifier of the fourth aspect, the bypass capacitance elements are capacitors.

According to a sixth aspect of the invention, in the wide-band amplifier of the fourth aspect, the bypass capacitance elements are reversely biased diodes.

According to a seventh aspect of the invention, there is provided a wide-band amplifier comprising:

a plurality of source follower circuits receiving biphase signals and connected in series, each of the source follower circuits comprising a first set of FETs including a first source follower FET and a first current source FET and a second set of FETs including a second source follower FET and a second current source FET; and
a peaking circuit provided in series between output terminals of an upstream source follower circuit and input terminals of a downstream source follower circuit, the peaking circuit comprising inductors that series-resonate with the downstream source follower circuit.

According to an eighth aspect of the invention, in the wide-band amplifier of the seventh aspect, the wide-band amplifier comprises at least two peaking circuits, and one of the peaking circuits has a different resonance frequency than at least one of the other peaking circuits.

According to a ninth aspect of the invention, there is provided a wide-band amplifier comprising:

a source follower circuit receiving biphase signals, comprising:
a first set of FETs including a first source follower FET and a first current source FET and a second set of FETs including a second source follower FET and a second current source FET; and
a capacitor provided between a gate terminal and a source terminal of each of the first and second current source FETs so that the capacitor and each of the first and second current source FETs constitute a reactance circuit.

According to a tenth aspect of the invention, in the wide-band amplifier of the ninth aspect, further provided are a first coupling capacitance element connecting the first current source FET and the second source follower FET and a second coupling capacitance element connecting the second current source FET and the first source follower FET so that the source follower circuit has a push-pull-type configuration.

According to an eleventh aspect of the invention, in the wide-band amplifier of the tenth aspect, the source terminals of the first and second current source FETs and the capacitors are connected to a voltage source via a diode.

According to a twelfth aspect of the invention, in the wide-band amplifier of the tenth aspect, wherein the source terminals of the first and second current source FETs and the capacitors are connected to a voltage source via a resistor.

According to a thirteenth aspect of the invention, in the wide-band amplifier of the first, fourth, or tenth aspect, the first and second coupling capacitance elements are capacitors.

According to a fourteenth aspect of the invention, in the wide-band amplifier of the first, fourth, or tenth aspect, the first and second coupling capacitance elements are reversely biased diodes.

In the wide-band amplifier of the first, second, third, thirteenth, or fourteenth aspect, since signals having an inverted relationship always appear at the source terminals of the pair of current source FETs, the connecting point of the source terminals of the pair of current source FETs serves as an imaginary ground and cancels out those signals. Therefore, there occurs no negative feedback to the current source FETs, to improve their switching characteristics, which in turn improves the high-speed switching characteristic of the wide-band amplifier. The coupling capacitance elements may be capacitors or reversely biased diodes.

In the wide-band amplifier of the fourth, fifth, sixth, thirteenth, or fourteenth aspect, the series feedback circuit consisting of the resistor and the bypass capacitance element is an effective high-frequency compensation circuit. By applying the series feedback circuit to each of the current source FETs, variation components of currents flowing through the current source FETs can be increased without increase of bias currents thereof. Further, the capacitances and resistances may be so set that the bypass capacitance elements respectively short-circuit the resistors in the vicinity of a high-frequency cut-off frequency, to thereby decrease a negative feedback amount and increase a gain. As a result, the bandwidth of the source follower circuit is increased to allow provision of a wide-band amplifier. The coupling capacitance elements may be capacitors or reversely biased diodes.

In the wide-band amplifier of the seventh aspect, by providing the peaking circuit in series between the output terminals of an upstream source follower circuit and the input terminals of a downstream source follower circuit, the peaking circuit is caused to series-resonate with the input capacitance of the downstream source follower circuit, to increase only a high-frequency current, i.e., a current flowing into the input of a next-stage circuit such as a wide-band amplifier. No bias circuit for supplying gate voltages of the current source FETs is needed unlike the case of the push-pull-type source follower circuit. Therefore, the driving ability is improved without increase of the power consumption. The resonance frequency can be varied by changing the inductances of the peaking circuit.

In the wide-band amplifier of the eighth aspect, by making the resonance frequency of one peaking circuit different from that of at least one of the other peaking circuits, the frequency characteristic becomes flat between the two resonance frequencies. A flat voltage gain characteristic can be obtained in a desired frequency range by deviating the resonance frequencies of the respective wide-band amplifiers from each other.

In the wide-band amplifier of the ninth aspect, the reactance circuit that includes the current source FET is equivalently regarded as having an inductance. Therefore, in a frequency range higher than a certain frequency, the impedance as viewed from the output terminal to the voltage source is much larger than the internal resistance of the current source FET. Further, a current can be set independently only by the current source FET. Thus, the reactance circuit configuration reduces degradation of the bandwidth in the source follower circuit.

In the wide-band amplifier of any one of the tenth to fourteenth aspects, the inductance of the reactance circuit becomes constant by using a frequency range where the transconductance of the current source FETs is flat with respect to a variation of the gate-source voltage of the current source FETs. Therefore, compared to the conventional push-pull-type source follower circuit, a drain current variation due to a drain voltage variation of the current source FETs can be suppressed, thereby reducing degradation of the switching characteristic. The coupling capacitance elements may be capacitors or reversely biased diodes.

DESCRIPTION OF THE PREFERRED EMBODIMENTS

Embodiment 1

Figure 1:
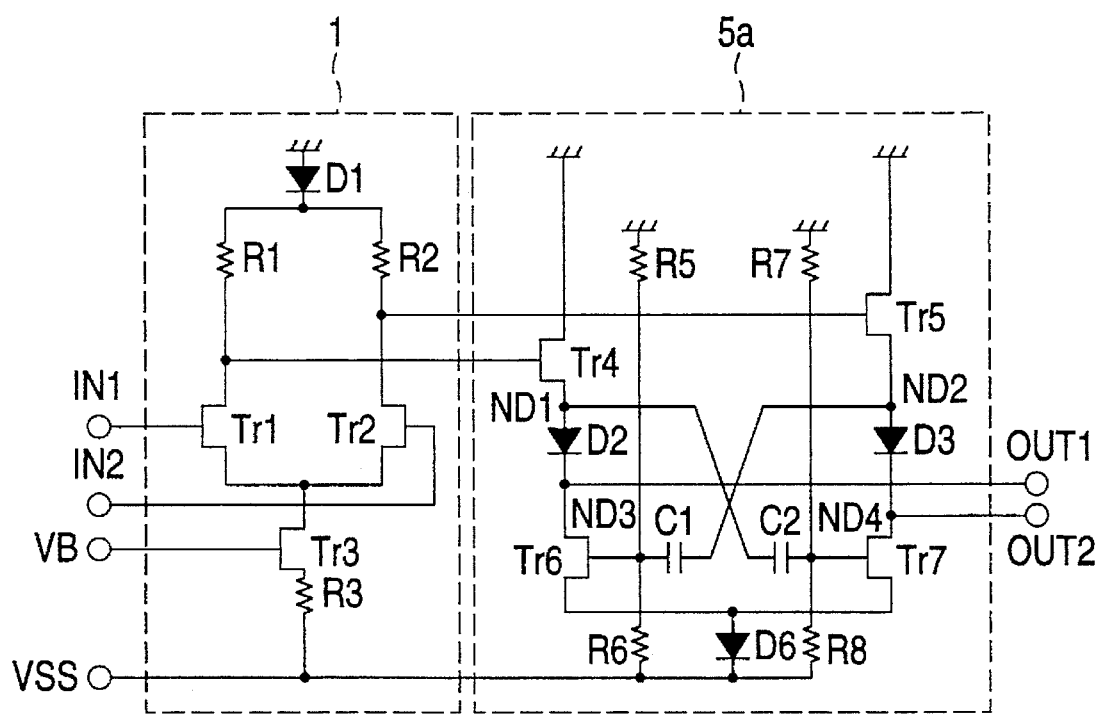
FIG. 1 is a circuit diagram showing a wide-band amplifier according to a first embodiment of the present invention.

FIG. 1 is a circuit diagram showing a wide-band amplifier capable of receiving biphase signals according to a first embodiment of the present invention. In FIG. 1, symbol $V_{SS}$ is a voltage source; IN1, an input terminal; IN2, an inverted input terminal; OUT1, an output terminal; and OUT2, an inverted output terminal. Reference numeral 1 denotes a differential amplifier. A source follower circuit 5a performs DC level shift on a signal that has been level-shifted by the differential amplifier 1, to obtain an input level that is required for a next-stage circuit.

The differential amplifier 1 of FIG. 1 is the same as the conventional differential amplifier 1. Tr1, Tr2 and Tr3 are FETS, R1 and R2 are load resistors, D1 is a level-shift diode, and R3 is a resistor.

In the source follower circuit 5a, source follower FETs Tr4 and Tr5, level-shift diodes D2 and D3, current source FETs Tr6 and Tr7, capacitors C1 and C2, and resistors R5–R8 are the same as those in the conventional source follower circuit 5. A gate voltage of the current source FET Tr6 is given by a bias circuit consisting of the resistors R5 and R6, and a gate voltage of the current source FET Tr7 is given by a bias circuit consisting of the resistors R7 and R8. A node ND1 at the source terminal of the source follower FET Tr4 is connected, via a capacitor C2, to a node ND4 at the gate terminal of the current source FET Tr7 of an inverted signal processing stage. A node ND2 at the source terminal of the source follower FET Tr5 of the inverted signal processing stage is connected, via a capacitor C1, to a node ND3 at the gate terminal of the current source FET Tr6. In this embodiment, the source terminals of the current source FETs Tr6 and Tr7 are connected to each other, and source voltages of the current source FETs Tr6 and Tr7 are given via the above connecting point and a diode D6, which is connected to the voltage source $V_{SS}$.

With the configuration shown in FIG. 1, since signals having an inverted relationship always appear at the source terminals of the respective constant current source FETs Tr6 and Tr7, the connecting point of the FETs Tr6 and Tr7 serves as an imaginary ground, to cancel out the two signals. As a result, negative feedback to the current source FETs Tr6 and Tr7 does not occur, to thereby improve the switching characteristics of the current source FETs Tr6 and Tr7, which means improvement of the high-speed switching characteristic of the wide-band amplifier.

Embodiment 2

Figure 2:
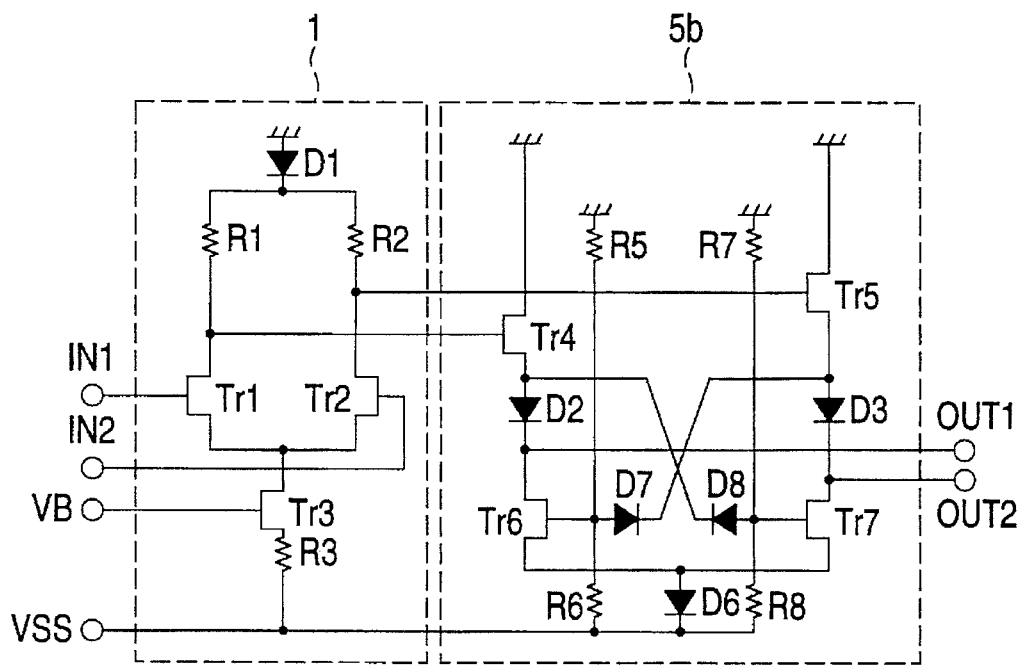
FIG. 2 is a circuit diagram showing a wide-band amplifier according to a second embodiment of the invention.

FIG. 2 is a circuit diagram showing a second embodiment. The components given the same reference symbols in FIGS. 1 and 2 are the same or corresponding ones. In FIG. 2, reversely biased diodes D7 and D8 are used in place of the capacitors C1 and C2 of FIG. 1. As in the case of the first embodiment, the wide-band amplifier of this embodiment can improve the high-speed switching characteristic.

Embodiment 3

Figure 3:
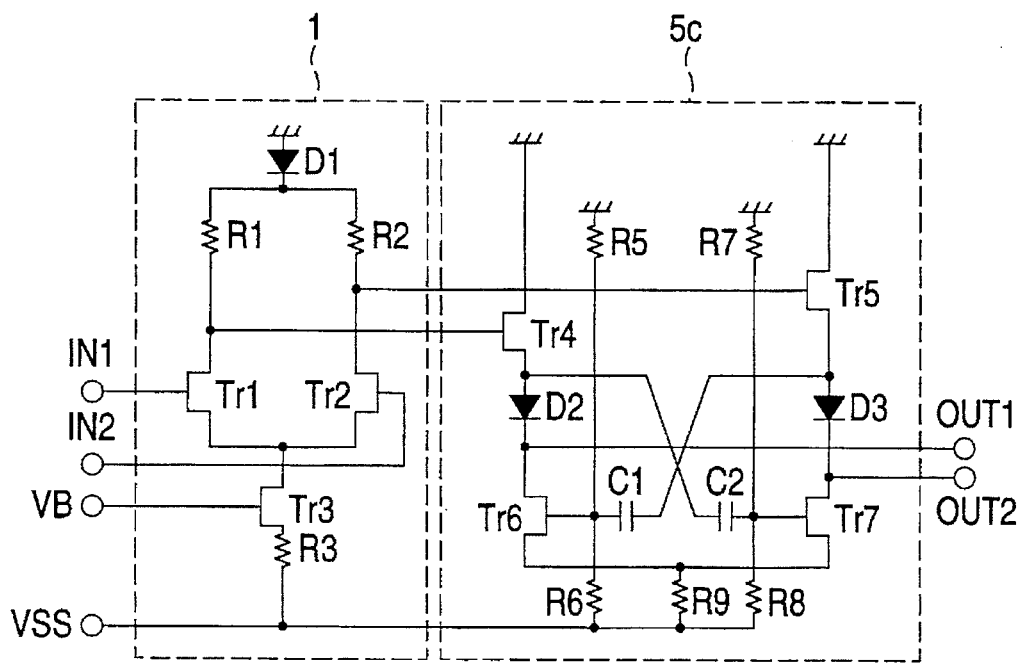
FIG. 3 is a circuit diagram showing a wide-band amplifier according to a third embodiment of the invention.

FIG. 3 is a circuit diagram showing a third embodiment. The components given the same reference symbols in FIGS. 1 and 3 are the same or corresponding ones. In FIG. 3, a resistor R9 is used in place of the diode D6 of FIG. 1. As in the case of the first embodiment, the wide-band amplifier of this embodiment can improve the high-speed switching characteristic. Further, the source voltages of the current source FETs Tr6 and Tr7 can be set arbitrarily.

In this embodiment, the capacitors C1 and C2 may be replaced by reversely biased diodes.

Embodiment 4

Figure 4:
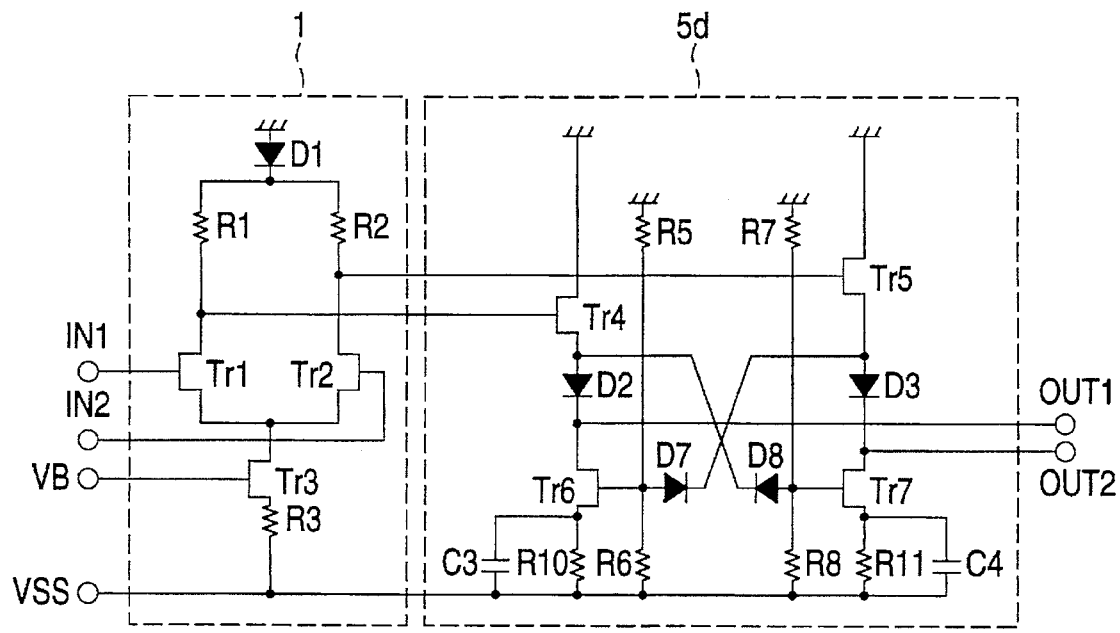
FIG. 4 is a circuit diagram showing a wide-band amplifier according to a fourth embodiment of the invention.

FIG. 4 is a circuit diagram showing a fourth embodiment of the invention. The components given the same reference symbols in FIGS. 2 and 4 are the same or corresponding ones. A parallel connection of a resistor R10 and a capacitor C3 (bypass capacitance element) is provided between the source terminal of the current source FET Tr6 and the voltage source $V_{SS}$. A parallel connection of a resistor R11 and a capacitor C4 (bypass capacitance element) is provided between the source terminal of the current source FET Tr7 and the voltage source $V_{SS}$.

In this embodiment, the series feedback using the resistor R10/capacitor C3 and the resistor R11/capacitor C4 constitutes effective high-frequency compensation circuits. By applying this series feedback to the current source FETs Tr6 and Tr7, variation components of currents flowing through the current source FETs Tr6 and Tr7 can be increased without increase of bias currents thereof. Further, the capacitances and resistances may be so set that the capacitors C3 and C4 respectively short-circuit the resistors R10 and R11 in the vicinity of a high-frequency cut-off frequency, to thereby decrease a negative feedback amount and increase a gain. As a result, the bandwidth of the source follower circuit 5d is increased to allow provision of a wide-band amplifier.

Embodiment 5

Figure 5:
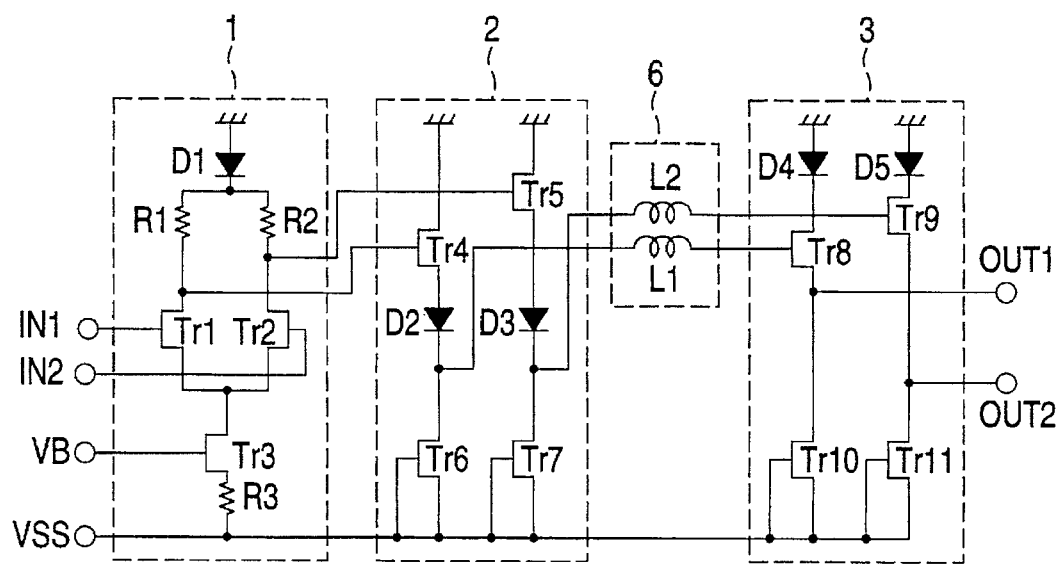
FIG. 5 is a circuit diagram showing a wide-band amplifier according to a fifth embodiment of the invention.
Figure 12:
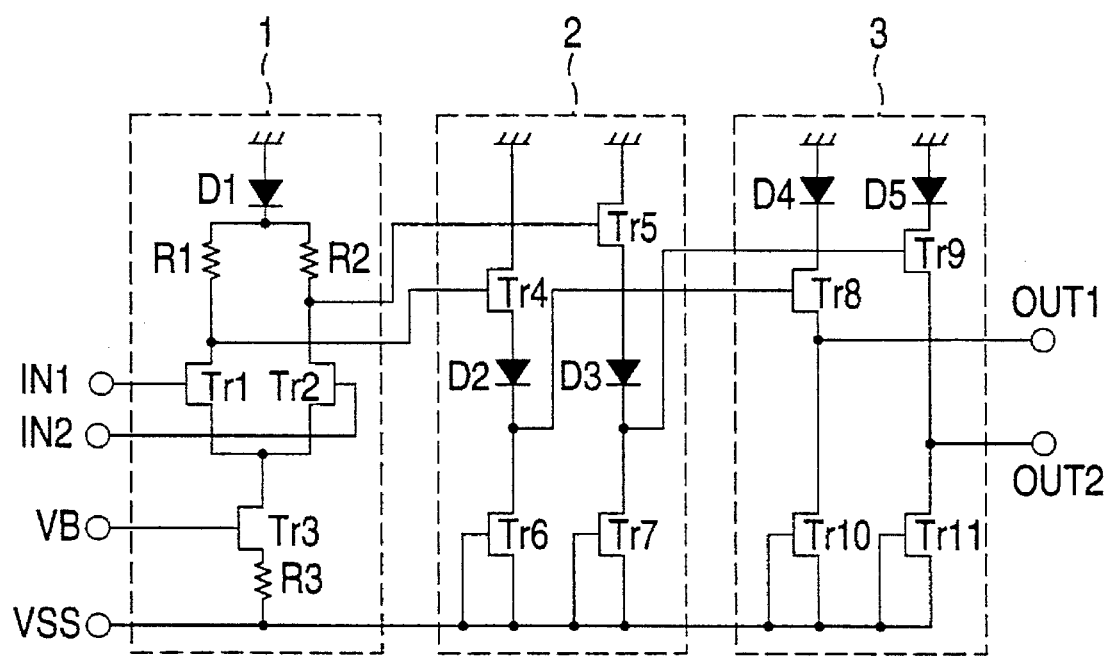
FIG. 12 is a circuit diagram showing a conventional wide-band amplifier.
Figure 13A:
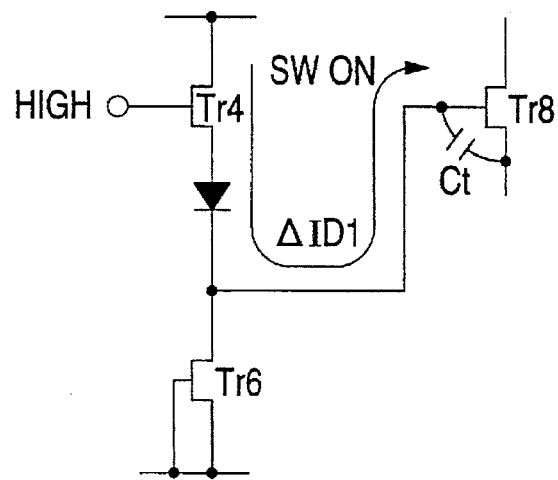
FIGS. 13A and 13B illustrate charging/discharging in source following circuits of the wide-band amplifier of FIG. 12.
Figure 13B:
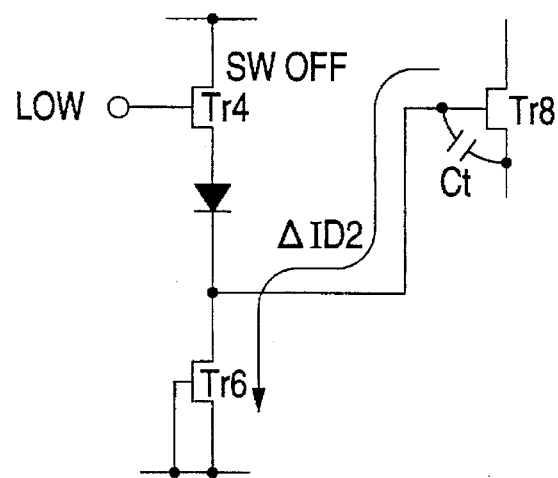

FIG. 5 is a circuit diagram showing a fifth embodiment of the invention. In FIG. 5, reference numeral 1 denotes a differential amplifier. A level-shift first source follower circuit 2 shifts an output voltage of the differential amplifier 1 to a predetermined level. An impedance conversion second source follower circuit 3 is connected to the first source follower circuit 2. Reference numeral 6 denotes a peaking circuit. The differential amplifier 1, the first source follower circuit 2, and the second source follower circuit 3 are the same as the conventional ones shown in FIG. 12. This embodiment is characterized by the peaking circuit 6 that is provided between the output terminals of the first source follower circuit 2 and the input terminals of the second source follower circuit 3.

In the differential amplifier 1, Tr1, Tr2 and Tr3 are FETs, R1 and R2 are load resistors, D1 is a level-shift diode, and R3 is a resistor.

In the first source follower circuit 2, Tr4 and Tr5 are source follower FETs, Tr6 and Tr7 are current source FETs, and D2 and D3 are level-shift diodes. The stage of the source follower FET Tr5 processes a signal that is inverted from a signal that is processed by the stage of the source follower FET Tr4.

In the second source follower circuit 3, D4 and D5 are level-shift diodes, Tr8 and Tr9 are source follower FETs, and Tr10 and TR11 are current source FETs. The stage of the source follower FET Tr9 processes a signal that is inverted from a signal that is processed by the stage of the source follower FET Tr8.

In the peaking circuit 6, an inductor L1 is provided between the inverted-signal output terminal (i.e., cathode electrode of the level-shift diode D2) of the stage of the source follower FET Tr4 and the inverted-signal input terminal (i.e., gate terminal of the source follower FET Tr8) of the second source follower circuit 3. An inductor L2 is provided between the non-inverted-signal output terminal (i.e., cathode electrode of the level-shift diode D3) of the stage of the source follower FET Tr5 and the non-inverted-signal input terminal (i.e., gate terminal of the source follower FET Tr9) of the second source follower circuit 3.

A series resonance circuit is formed by the inductor L1 and the input capacitance of the source follower FET Tr8, so that a high-frequency current flowing through the source follower FET Tr8, i.e., a current flowing into the input of a next-stage circuit such as a wide-band amplifier is increased. Similarly, the inductor L2 increases a high-frequency current flowing through the source follower FET Tr9.

By virtue of the use of the peaking circuit 6, which increases only a high-frequency current, no bias circuit for supplying gate voltages of the current source FETs is needed unlike the case of the push-pull-type source follower circuit (the bias circuit of FIG. 1 including the resistors R5–R8). Therefore, the driving ability is improved without increase of the power consumption.

The series resonance effect of the peaking circuit 6 is weaker if the output impedances of the portions of the prior-stage circuit to which the inductors L1 and L2 are connected are larger. Therefore, the circuit configuration of this embodiment, in which the peaking circuit 6 is connected to the output terminals of the impedance-reduced first source follower circuit 2 rather than provided between the output terminals of the differential amplifier 1 and the input terminals of the first source follower circuit 2, maximizes the series resonance effect.

The resonance frequency of the peaking circuit 6 can be varied by changing the inductance of the inductors L1 and L2.

Further, the bandwidth of the wide-band amplifier can be increased by setting the resonance frequency of the peaking circuit 6 close to the high-frequency cut-off frequency of the wide-band amplifier.

Embodiment 6

Figure 6:
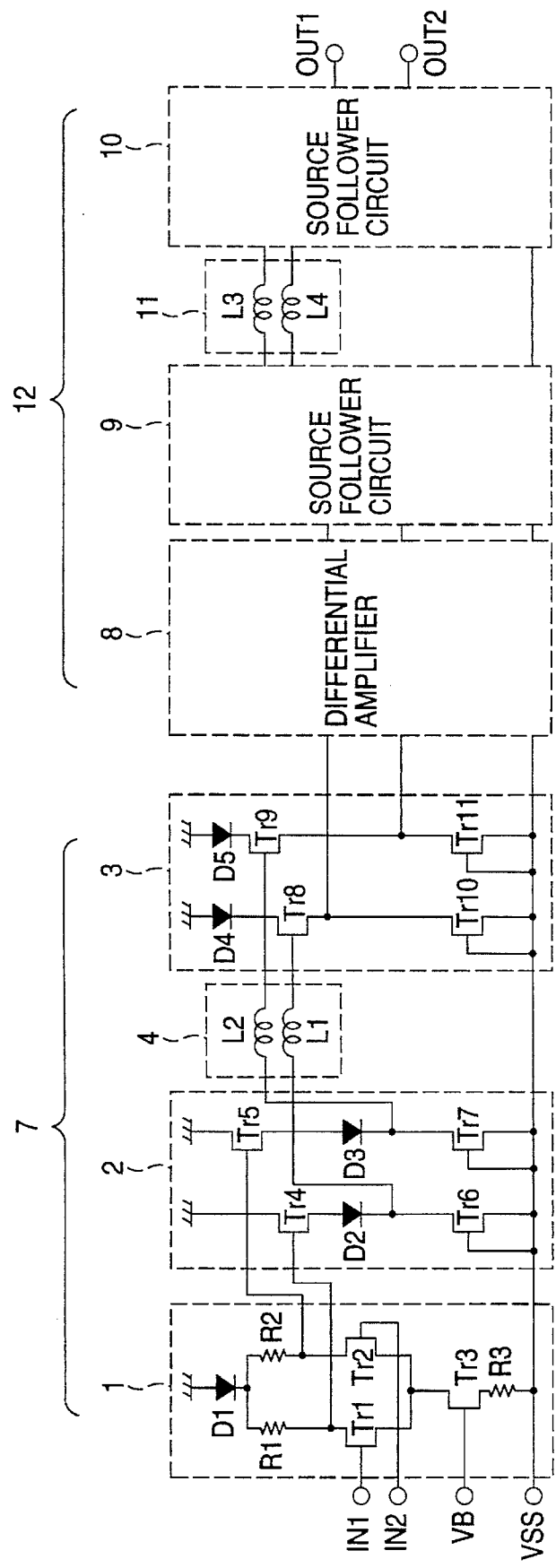
FIG. 6 is a circuit diagram showing a wide-band amplifier according to a sixth embodiment of the invention.

FIG. 6 is a circuit diagram showing a sixth embodiment of the invention. In this embodiment, as shown in FIG. 6, a first wide-band amplifier 7 having a peaking circuit 6 that consists of inductors L1 and L2 and a second wide-band amplifier 12 having a peaking circuit 11 that consists of inductors L3 and L4 are connected to each other in series. The first wide-band amplifier 7 includes a differential amplifier 1, a level-shift first source follower circuit 2, an impedance conversion second source follower circuit 3, and the peaking circuit 6 provided between the output terminals of the first source follower circuit 2 and the input terminals of the second source follower circuit 3. The second wide-band amplifier 12 includes a differential amplifier 8, a level-shift first source follower circuit 9, an impedance conversion second source follower circuit 10, and the peaking circuit 11 provided between the output terminals of the first source follower circuit 9 and the input terminals of the second source follower circuit 10.

An inductance $L_f$ of the inductors L1 and L2 of the resonance circuit 6 and its resonance frequency $f_f$ are made different from an inductance $L_s$ of the inductors L3 and L4 of the peaking circuit 11 and its resonance frequency $f_s$; that is, a relationship $f_f \neq f_s$ is established.

Figure 7:
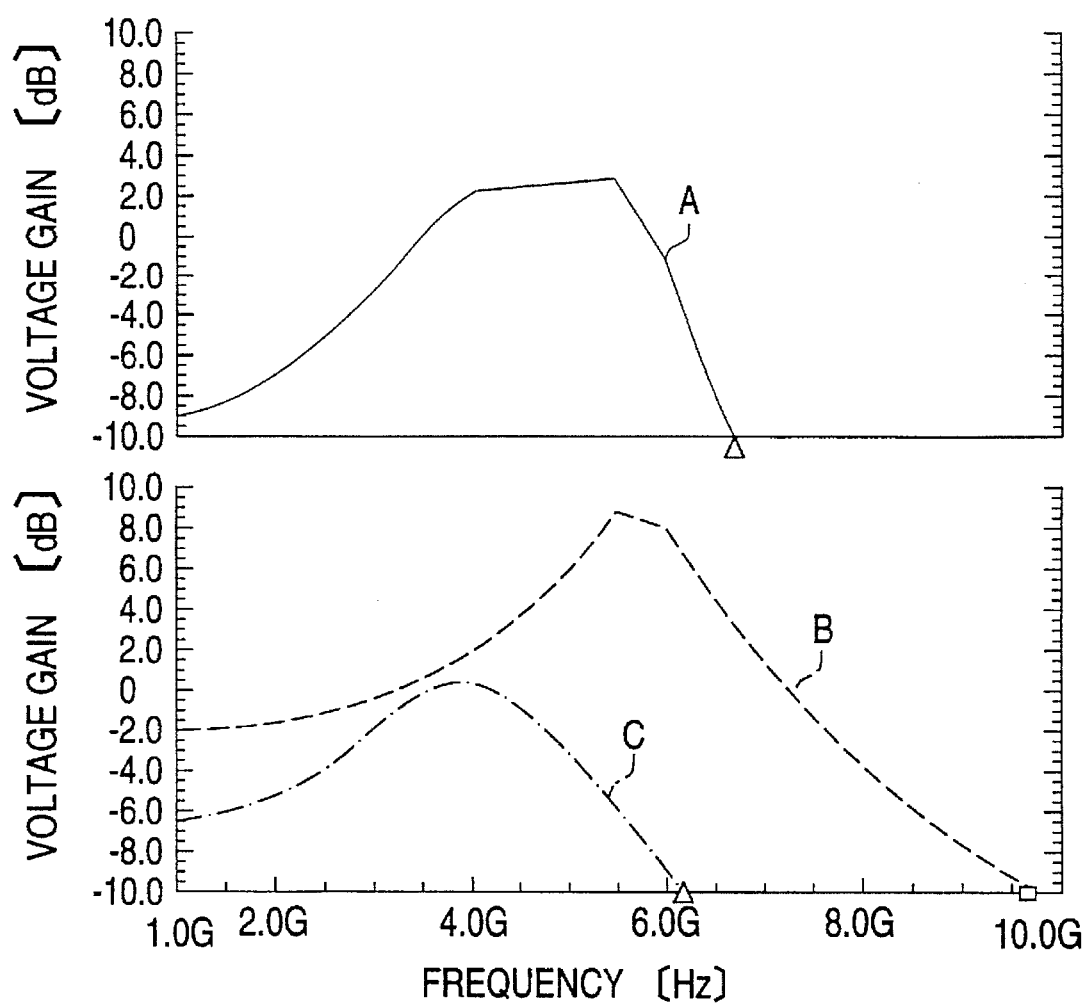
FIG. 7 is a graph showing frequency characteristics of the wide-band amplifier of FIG. 6.

FIG. 7 shows bandwidth characteristics of the first and second wide-band amplifiers 7 and 12. More specifically, a solid line A represents a frequency characteristic the voltage gain of the entirety of the first and second wide-band amplifiers 7 and 12, a chain line C represents a frequency characteristic of the voltage gain of only the first wide-band amplifier 7, and a dashed line B represents a frequency characteristic of the voltage gain of only the second wide-band amplifier 12.

As seen from FIG. 7, the frequency characteristic (solid line A) is flat between a resonance frequency $f_f (\approx 4$ GHz) of the first wide-band amplifier 7 (chain line C) and a resonance frequency $f_s (\approx 5.5$ GHz) of the second wide-band amplifier 12 (dashed line B). In this manner, a flat voltage gain characteristic can be obtained in a desired frequency range by deviating the resonance frequencies of the respective wide-band amplifiers from each other.

Embodiment 7

Figure 8:
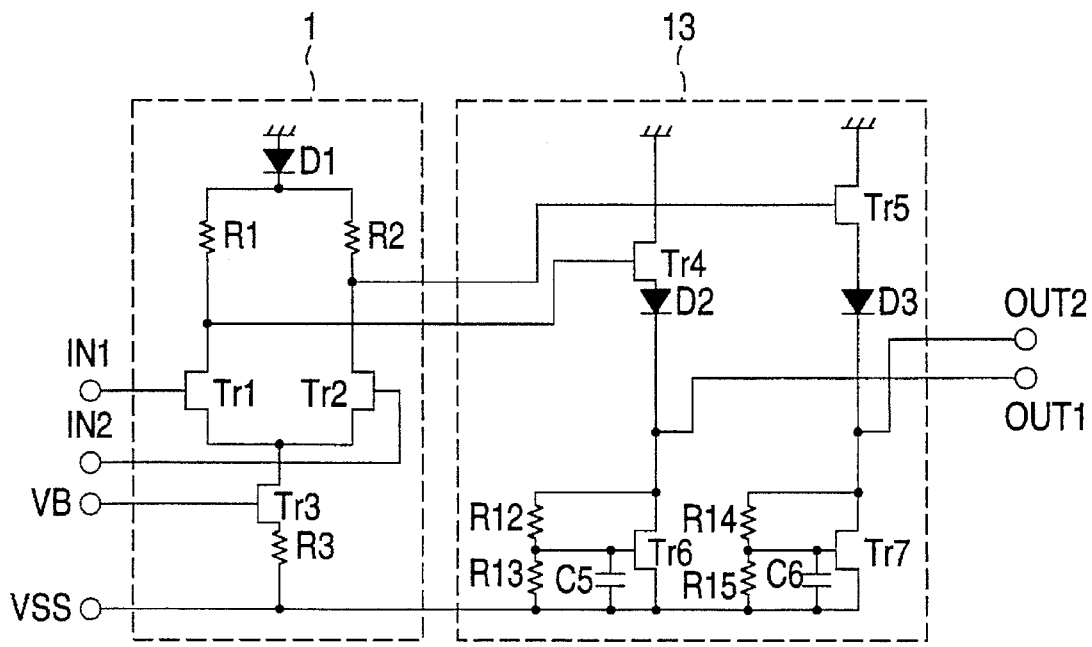
FIG. 8 is a circuit diagram showing a wide-band amplifier according to a seventh embodiment of the invention.

FIG. 8 is a circuit diagram showing a seventh embodiment of the invention. The components given the same symbols in FIGS. 1 and 8 are the same or corresponding ones. Reference numeral 13 denotes a source follower circuit, R12–R15 are resistors, and C5 and C6 are capacitors.

A gate voltage of the current source FET Tr6 is given by a bias circuit consisting of the resistors R12 and R13 that are provided between the drain terminal and the voltage source $V_{SS}$. The capacitor C5 is provided between the gate terminal of the current source FET Tr6 and the voltage source $V_{SS}$ and in parallel with the resistor R13. Similarly, a gate voltage of the current source FET Tr7 is given by a bias circuit consisting of the resistors R14 and R15 that are provided between the drain terminal and the voltage source $V_{SS}$. The capacitor C6 is provided between the gate terminal of the current source FET Tr7 and the voltage source $V_{SS}$ and in parallel with the resistor R15.

The resistor R12, the capacitor C5, and the current source FET Tr6 constitute a known reactance circuit that equivalently has an inductance L=(capacitance of the capacitor C5)×(resistance of the resistor R12)/(transconductance $g_m$ of the current source FET Tr6). Therefore, in a frequency range higher than a certain frequency, the impedance as viewed from the output terminal OUT1 to the voltage source $V_{SS}$ is much larger than the internal resistance of the current source FET Tr6, that is, (2π×frequency×L)>(internal resistance $R_{ds}$ of the current source FET Tr6). Further, a current can be set independently only by the current source FET Tr6. The same things apply to the circuit consisting of the resistor R15, the capacitor C6, and the current source FET Tr7.

Figure 9:
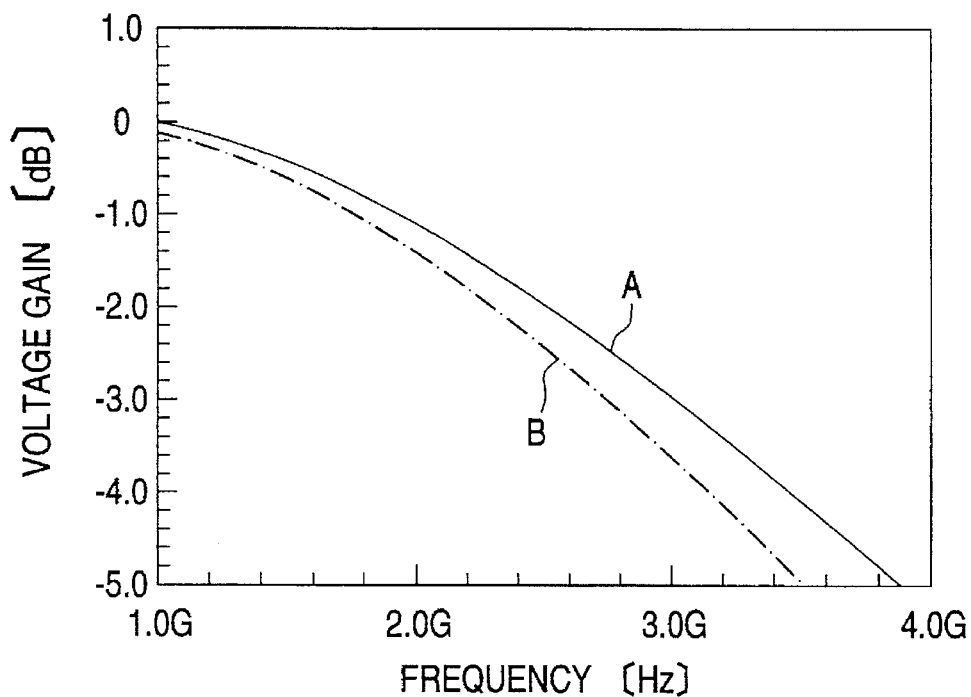
FIG. 9 is a graph showing frequency characteristics of the wide-band amplifier of FIG. 8.

FIG. 9 shows a frequency characteristic of the wide-band amplifier of this embodiment. In FIG. 9, a solid line A represents a frequency characteristic of the voltage gain of the wide-band amplifier of this embodiment, and a chain line B represents a frequency characteristic of the voltage gain of the conventional wide-band amplifier. As seen from FIG. 9, the bandwidth reduction due to the source follower circuit can be suppressed by the reactance circuits as employed in this embodiment.

Embodiment 8

Figure 10:
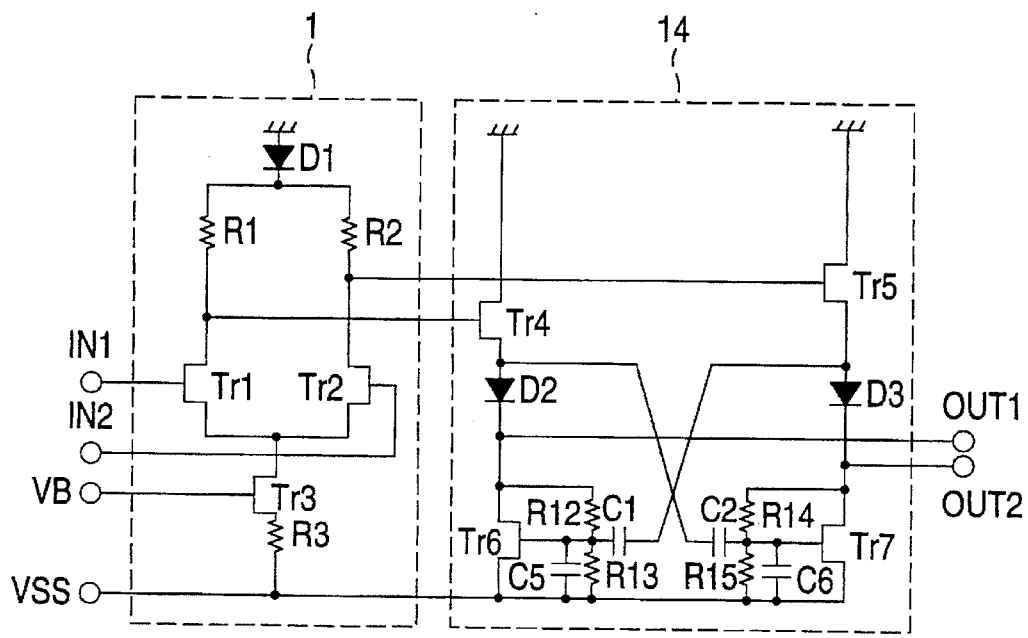
FIG. 10 is a circuit diagram showing a wide-band amplifier according to an eighth embodiment of the invention.

FIG. 10 is a circuit diagram showing an eighth embodiment of the invention, which employs a source follower circuit 14 that is a modification of the source follower circuit of the seventh embodiment. The source follower circuit 14 has a push-pull-type configuration in which a voltage variation at the source follower FET Tr5 is supplied to the gate terminal of the current source FET Tr6 via a capacitor C1 and a voltage variation at the source follower FET Tr4 is supplied to the gate terminal of the current source FET Tr7 via a capacitor C2.

Figure 14:
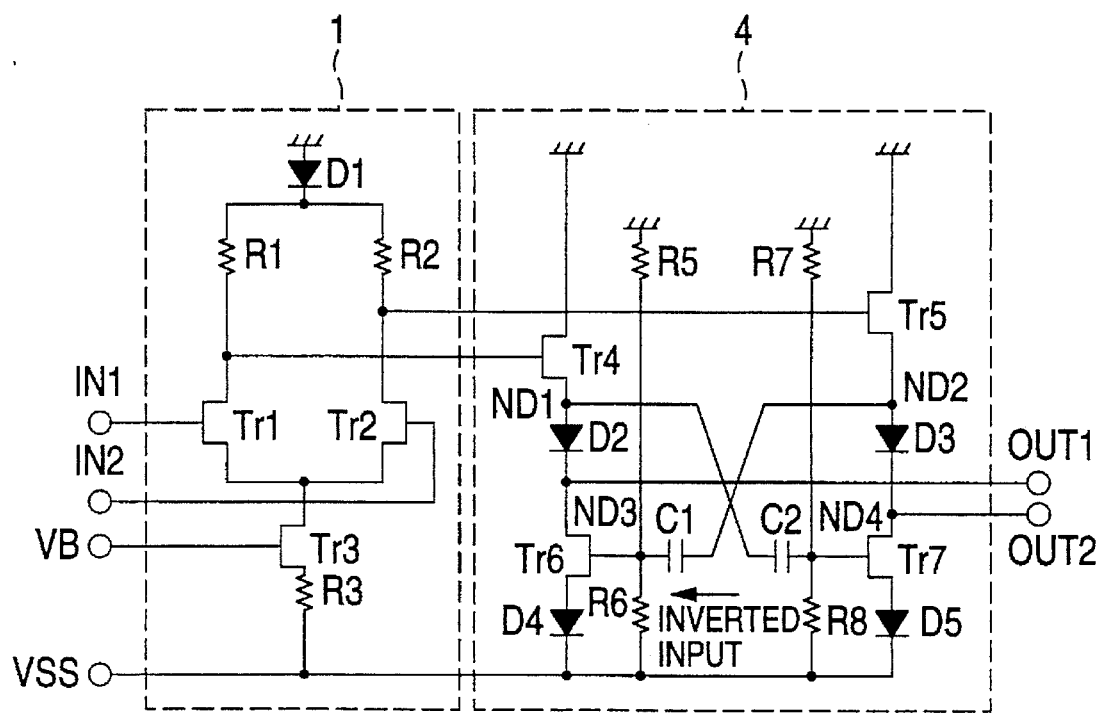
FIG. 14 is a circuit diagram showing a conventional wide-band amplifier having a push-pull-type source follower circuit.

The inductance L of the reactance circuit becomes constant by using a frequency range where the transconductance $g_m$ of the current source FETs Tr6 and Tr7 is flat with respect to a variation of the gate-source voltage of the current source FETs Tr6 and Tr7. Therefore, compared to the conventional push-pull-type source follower circuit 4 shown in FIG. 14, a drain current variation due to a drain voltage variation of the current source FETs Tr6 and Tr7 can be suppressed, thereby reducing degradation of the switching characteristic.

The capacitors C1 and C2 may be replaced by reversely biased diodes.

Figure 11:
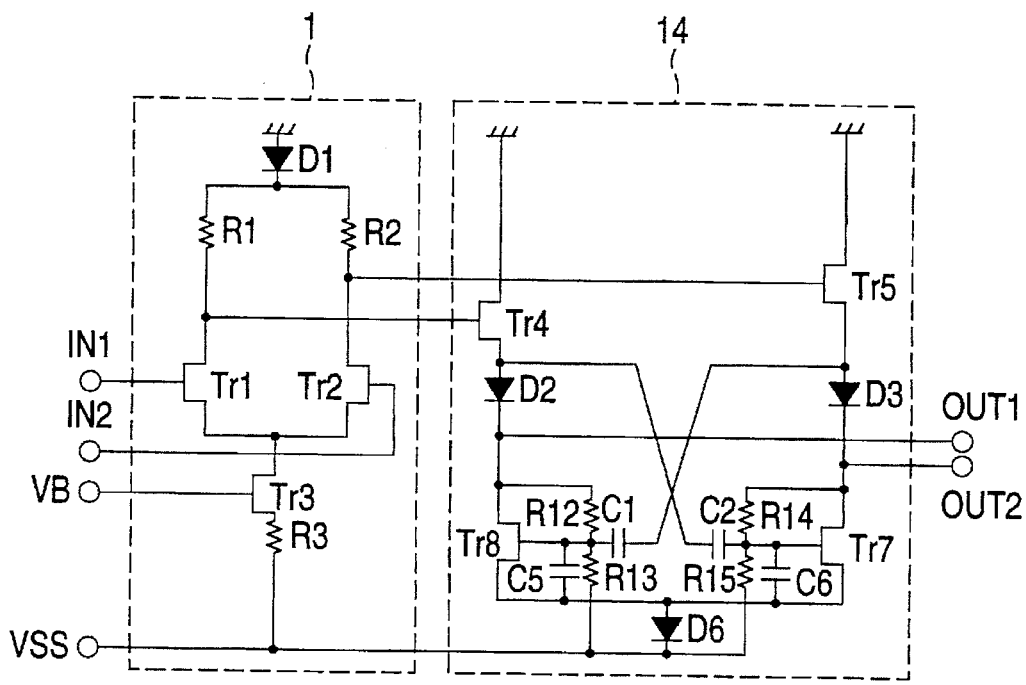
FIG. 11 is a circuit diagram showing a wide-band amplifier that is a modification of the wide-band amplifier of FIG. 10.

The capacitors C1 and C2 and the source terminals of the current source FETs Tr6 and Tr7 may be connected to the voltage source $V_{SS}$ via a diode D6 (see FIG. 11) or a resistor.

What is claimed is:

1. A wide-band amplifier comprising:
   a push-pull-type source follower circuit receiving biphase signals, said circuit including:
   a first set of FETs including a first source follower FET and a first current source FET and a second set of FETs including a second source follower FET and a second current source FET, source terminals of the first and second current FETs being connected to each other;
   a first coupling capacitance element connecting the first current source FET and the second source follower FET;
   a second coupling capacitance element connecting the second current source FET and the first source follower FET; and
   an element having a resistance component and connecting a connecting point of the source terminals of the first and second current source FETs to a voltage source.

2. The wide-band amplifier according to claim 1, wherein said element having a resistance component includes a diode.

3. The wide-band amplifier according to claim 1, wherein said element having a resistance component includes a resistor.

4. The wide-band amplifier according to claim 1, wherein the first and second coupling capacitance elements are capacitors.

5. The wide-band amplifier according to claim 1, wherein the first and second coupling capacitance elements include reverse biased diodes.

6. A wide-band amplifier comprising:
   a push-pull-type source follower circuit receiving biphase signals, said circuit including:
   a first set of FETs including a first source follower FET and a first current source FET and a second set of FETs including a second source follower FET and a second current source FET;
   a first coupling capacitance element connecting the first current source FET and the second source follower FET;
   a second coupling capacitance element connecting the second current source FET and the first source follower FET;
   resistors connecting respective source terminals of the first and second current source FETs to a voltage source; and
   bypass capacitance elements connected in parallel to the respective resistors.

7. The wide-band amplifier according to claim 6, wherein the bypass capacitance elements include capacitors.

8. The wide-band amplifier according to claim 6, wherein the bypass capacitance elements include reverse biased diodes.

9. The wide-band amplifier according to claim 6, wherein the first and second coupling capacitance elements include capacitors.

10. The wide-band amplifier according to claim 6, wherein the first and second coupling capacitance elements include reverse biased diodes.

11. A wide-band amplifier comprising:
    a plurality of source follower circuits receiving biphase signals and connected in series, each of the source follower circuits comprising a first set of FETs including a first source follower FET and a first current source FET and a second set of FETs including a second source follower FET and a second current source FET; and
    a peaking circuit provided in series between output terminals of an upstream source follower circuit and input terminals of a downstream source follower circuit, the peaking circuit comprising first and second inductors and being in series resonance with the downstream source follower circuit.

12. The wide-band amplifier according to claim 11, further comprising at least two peaking circuits, one of the peaking circuits having a different resonance frequency than at least one of the other peaking circuits.

13. A wide-band amplifier comprising:
    a source follower circuit receiving biphase signals, said circuit including:
    a first set of FETs including a first source follower FET and a first current source FET and a second set of FETs including a second source follower FET and a second current source FET; and
    a capacitor provided between a gate terminal and a source terminal of each of the first and second current source FETs so that the capacitor and each of the first and second current source FETs constitute a reactance circuit.

14. The wide-band amplifier according to claim 13, further comprising a first coupling capacitance element connecting the first current source FET and the second source follower FET and a second coupling capacitance element connecting the second current source FET and the first source follower FET so that the source follower circuit has a push-pull-type configuration.

15. The wide-band amplifier according to claim 14, wherein the source terminals of the first and second current source FETs and the capacitors are connected to a diode, and means for connecting the diode to a voltage source.

16. The wide-band amplifier according to claim 14, wherein the source terminals of the first and second current source FETs and the capacitors are connected to a resistor and means for connecting the resistor to a voltage source.

17. The wide-band amplifier according to claim 14, wherein the first and second coupling capacitance elements include capacitors.

18. The wide-band amplifier according to claim 14, wherein the first and second coupling capacitance elements include reverse biased diodes.

* * * * *